US011158367B1

(12) United States Patent
Marr et al.

(10) Patent No.: US 11,158,367 B1
(45) Date of Patent: Oct. 26, 2021

(54) SEMICONDUCTOR DEVICE PROTECTION CIRCUITS FOR PROTECTING A SEMICONDUCTOR DEVICE DURING PROCESSING THEREOF, AND ASSOCIATED METHODS, DEVICES, AND SYSTEMS

(71) Applicant: Micron Technology, Inc., Boise, ID (US)

(72) Inventors: Kenneth W. Marr, Boise, ID (US); Michael A. Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/846,120

(22) Filed: Apr. 10, 2020

(51) Int. Cl.
| | |
|---|---|
| *G11C 7/24* | (2006.01) |
| *G11C 11/4078* | (2006.01) |
| *G11C 16/22* | (2006.01) |
| *G11C 16/04* | (2006.01) |
| *G11C 8/20* | (2006.01) |
| *G11C 11/22* | (2006.01) |
| *G11C 11/16* | (2006.01) |

(52) U.S. Cl.
CPC ............ *G11C 11/4078* (2013.01); *G11C 7/24* (2013.01); *G11C 8/20* (2013.01); *G11C 11/1695* (2013.01); *G11C 11/2295* (2013.01); *G11C 16/0483* (2013.01); *G11C 16/22* (2013.01)

(58) Field of Classification Search
CPC ... G11C 7/24; G11C 11/1695; G11C 11/2295; G11C 11/4078
See application file for complete search history.

(56) References Cited

U.S. PATENT DOCUMENTS

| | | | | |
|---|---|---|---|---|
| 5,617,356 | A * | 4/1997 | Golla | G11C 16/14 365/185.23 |
| 5,787,044 | A * | 7/1998 | Duesman | G11C 11/4074 365/149 |
| 6,249,410 | B1 * | 6/2001 | Ker | H01L 27/0251 361/111 |
| 6,442,009 | B1 * | 8/2002 | Kameda | G11C 29/50 361/56 |
| 6,507,469 | B2 * | 1/2003 | Andoh | H01L 27/0255 361/212 |
| 7,965,538 | B2 * | 6/2011 | Ahn | G11C 13/0007 365/148 |
| 10,050,049 | B2 | 8/2018 | Tanzawa | |
| 10,840,237 | B2 * | 11/2020 | Tsai | H01L 27/0296 |
| 2002/0195648 | A1 * | 12/2002 | Hirata | H01L 27/0274 257/315 |
| 2003/0227447 | A1 * | 12/2003 | Takeuchi | G09G 3/3473 345/204 |

(Continued)

*Primary Examiner* — Mushfique Siddique
(74) *Attorney, Agent, or Firm* — TraskBritt

(57) ABSTRACT

Memory devices are disclosed. A memory device may include a source (SRC) plate configured to couple to a number of memory cells. The memory device may also include a resistor coupled between the source plate and a node. Further, the memory device may include at least one transistor coupled between the source plate and the ground voltage, wherein a gate of the at least one transistor is coupled to the node. The transistor may be configured to couple the SRC plate to the ground voltage during a processing stage. The transistor may further be configured to isolate the SRC plate from the ground voltage during an operation stage. Methods and electronic systems are also disclosed.

16 Claims, 8 Drawing Sheets

(56) References Cited

U.S. PATENT DOCUMENTS

| | | | |
|---|---|---|---|
| 2006/0087781 A1* | 4/2006 | Ishizuka | H01L 27/0251 361/56 |
| 2013/0278220 A1* | 10/2013 | Cao | H01M 10/4257 320/134 |
| 2014/0286085 A1* | 9/2014 | Miyakawa | G11C 5/147 365/158 |
| 2016/0300610 A1 | 10/2016 | Kolluri et al. | |
| 2017/0206977 A1 | 7/2017 | Goda et al. | |
| 2019/0067475 A1 | 2/2019 | Liu et al. | |
| 2019/0252032 A1* | 8/2019 | Chih | H01L 27/0251 |

* cited by examiner

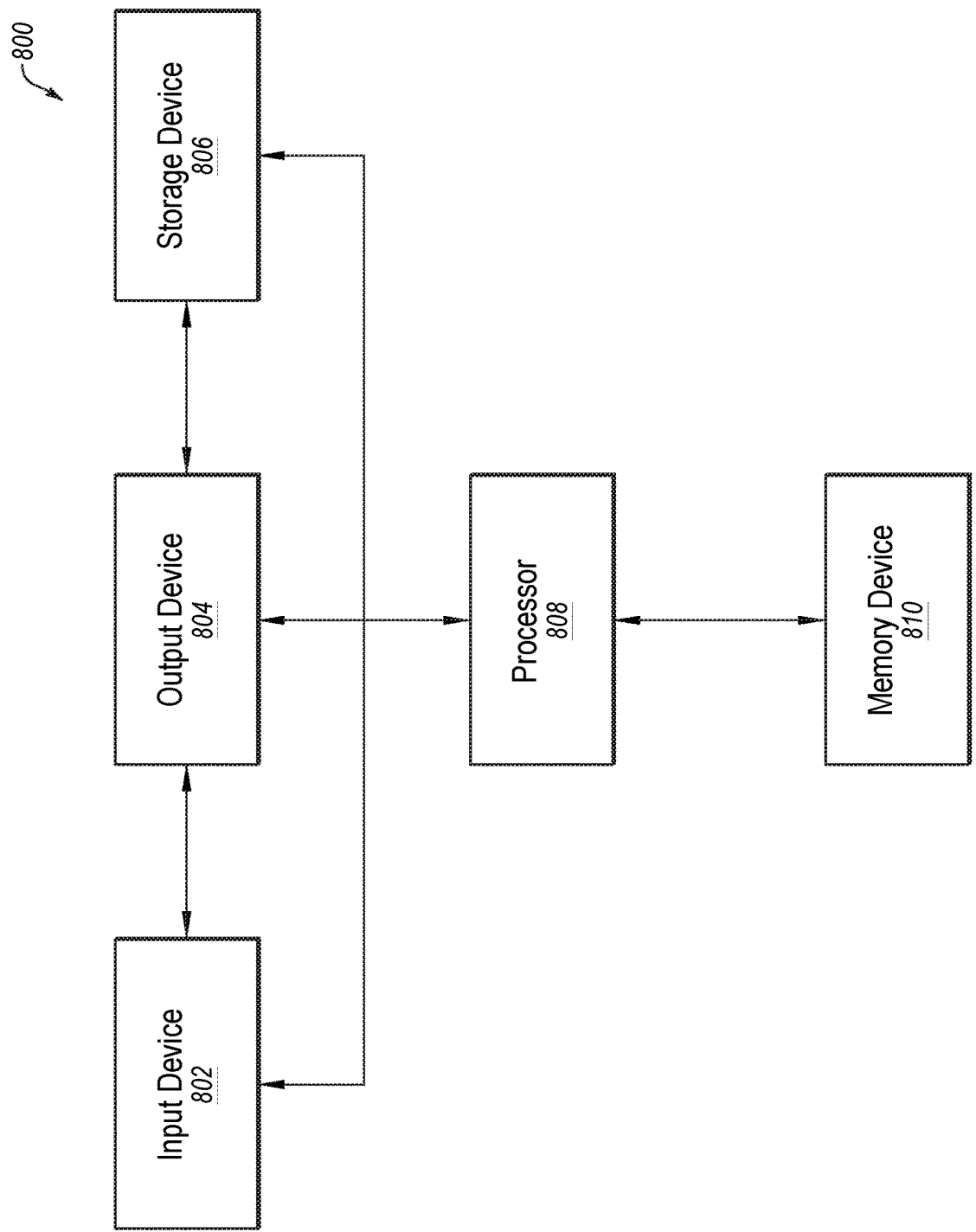

SEMICONDUCTOR DEVICE PROTECTION CIRCUITS FOR PROTECTING A SEMICONDUCTOR DEVICE DURING PROCESSING THEREOF, AND ASSOCIATED METHODS, DEVICES, AND SYSTEMS

TECHNICAL FIELD

Embodiments of the disclosure relate generally to protection circuits. More specifically, various embodiments relate to protection circuits configured to protect a semiconductor device during processing thereof, and to related methods, devices, and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory. Memory devices typically include many memory cells that are capable of holding a charge that is representative of a bit of data. Typically, these memory cells are arranged in a memory array. Data may be written to or retrieved from a memory cell by selectively activating the memory cell via an associated word line driver.

As will be appreciated by a person having ordinary skill in the art, during processing of a semiconductor device (e.g., a memory device, such as a 2D or 3D NAND device), a source (SRC) plate (e.g., formed via one or more conductive materials, such as polysilicon, silicide, or a combination thereof) of the semiconductor device may be biased to high voltages (e.g., during an etching process). More specifically, for example, during one or more "offending" processing steps (e.g., etching of a deep contact to or near the SRC plate), the SRC plate may be undesirably biased to high voltages (e.g., around 25-35 volts or more). As will also be appreciated, conventional controlling circuitry (e.g., SRC controlling circuitry, such as high voltage discharge circuitry) may not exhibit a sufficiently low breakdown voltage to prevent the SRC plate from reaching such high voltages during processing. The presence of a high voltage on the SRC plate may cause high electric fields between nearby features (e.g., grounded features created from the same polysilicon level as the SRC plate). In other words, because through-array contacts may be effectively grounded during an etching process, and the SRC plate may float to a high voltage, the lateral dielectric between the SRC plate and a landing pad (i.e., for a through-array contact) may be overly stressed. This stress may result in either diminished probe yield or reliability failures due to breakdown of the weakened dielectric between the SRC plate and the nearby polysilicon features (e.g., during erase operations when the SRC plate is biased to a high voltage).

BRIEF DESCRIPTION OF THE DRAWINGS

FIG. 8 is a simplified block diagram of an electronic system, in accordance with various embodiments of the present disclosure.

DETAILED DESCRIPTION

Figure 1:
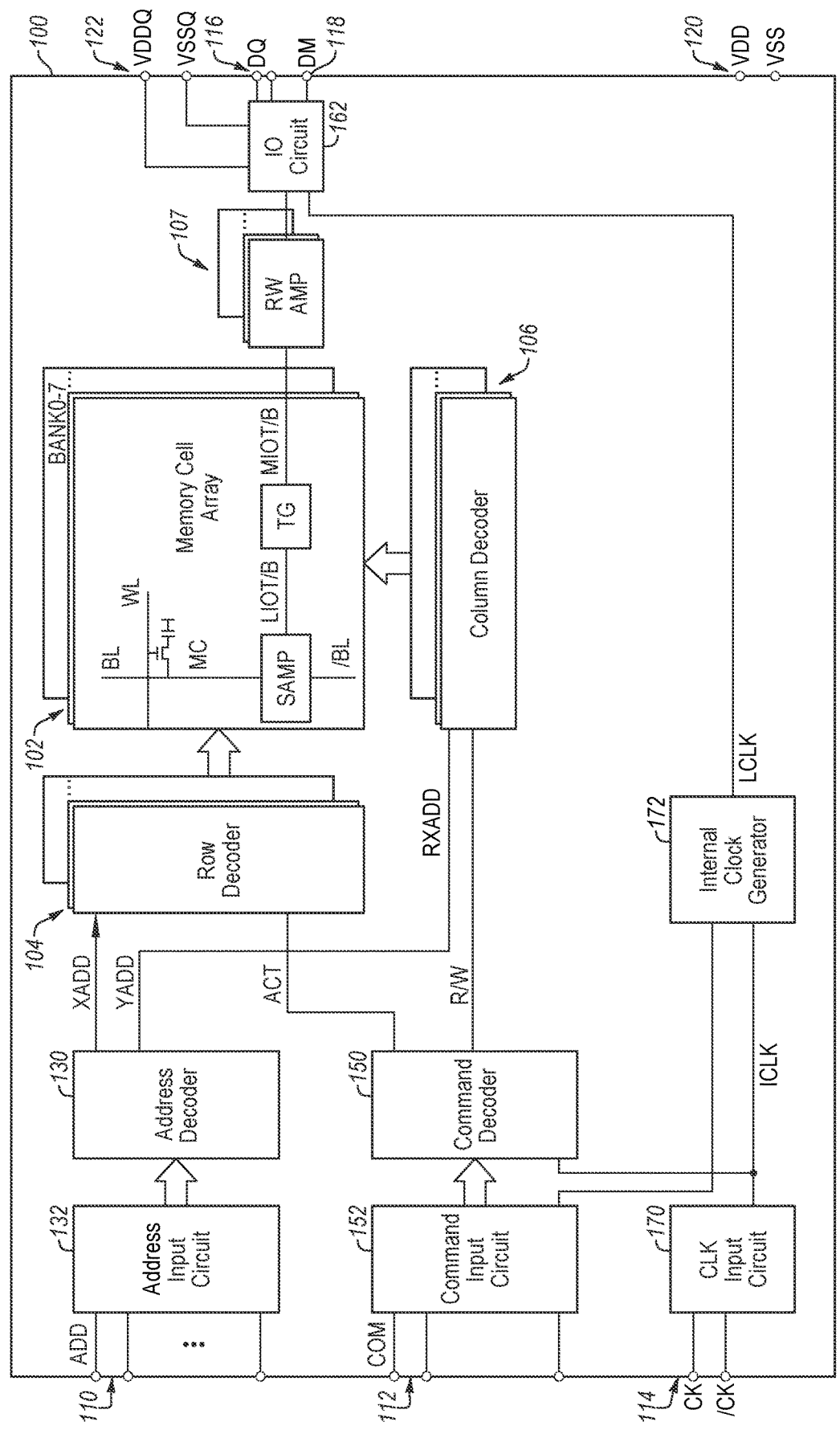
FIG. 1 is a block diagram of an example memory device, in accordance with at least one embodiment of the present disclosure.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, the electronic device may read, or sense, the stored information in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. A non-volatile memory device (e.g., flash memory) can store data for extended periods of time even in the absence of an external power source. A volatile memory device (e.g., DRAM) may lose its stored state over time unless it is periodically refreshed by an external power source. A binary memory device may, for example, include a charged or discharged capacitor.

Memory provides data storage for electronic systems. Flash memory is one of various memory types and has numerous uses in modern computers and devices. A typical flash memory device may include a memory array that has a large number of charge storage devices (e.g., memory cells, e.g., non-volatile memory cells) arranged in rows and columns. In a NAND architecture type of flash memory, storage devices arranged in a column are coupled in series, and a first storage device of the column is coupled to a bit line. In "two-dimensional NAND" (which may also be referred to herein as "2D NAND"), the storage devices are arranged in row and column fashion along a horizontal surface. In "three-dimensional NAND" (which may also be referred to herein as "3D NAND"), a type of vertical memory, not only are the storage devices arranged in row and column fashion in a horizontal array, but tiers of the horizontal arrays are stacked over one another to provide a "three-dimensional array" of the storage devices.

In 3D NAND, access lines, which may also be known as "word lines," may each operably connect the storage devices corresponding to a respective tier of the three-dimensional array. In 2D NAND, access lines may operably connect storage devices corresponding to a row or column of the two-dimensional array. In either 2D or 3D NAND, string drivers may be in operational communication with the access lines. That is, the string drivers may drive the access line (e.g., word line) voltages to write to or read from the charge storage devices of the arrays. Each charge storage device may be electrically programmed by charging a floating gate of the device, and the charging is controlled, at least in part, by operation of the string driver. As another example, a charge storage device may be programmed via a trapping layer (e.g., one or more nitride layers).

As will be appreciated by a person having ordinary skill in the art, during processing of a semiconductor device (e.g., a memory device, such as a 2D or 3D NAND device), a source (SRC) plate (e.g., formed via one or more conductive materials, such as polysilicon, silicide, or a combination thereof) of the semiconductor device may be biased to high voltages (e.g., during an etching process). More specifically, for example, during one or more "offending" processing steps (e.g., etching of a deep contact to or near the SRC plate), the SRC plate may be undesirably biased to high voltages (e.g., around 25-35 volts or more). As will also be appreciated, conventional controlling circuitry (e.g., SRC controlling circuitry, such as high voltage discharge circuitry) may not exhibit a sufficiently low breakdown voltage to prevent the SRC plate from reaching such high voltages during processing. The presence of a high voltage on the SRC plate may cause high electric fields between nearby features (e.g., grounded features created from the same polysilicon level as the SRC plate). In other words, because through-array contacts may be effectively grounded during an etching process, and the SRC plate may float to a high voltage, the lateral dielectric between the SRC plate and a landing pad (i.e., for a through-array contact) may be overly stressed. This stress may result in either diminished probe yield or reliability failures due to breakdown of the weakened dielectric between the SRC plate and the nearby polysilicon features (e.g., during erase operations when the SRC plate is biased to a high voltage).

As described more fully below, various embodiments described herein may be related to protecting various portions of a semiconductor device during processing thereof, and not interfering with operation of the semiconductor device (i.e., after completion of semiconductor processing). More specifically, various embodiments relate to a protection circuit (i.e., of a semiconductor device) configured to protect (e.g., during processing of the semiconductor device) a dielectric positioned proximate (e.g., between) an SRC plate and neighboring landing pads, with minimal die-size impact. Further, according to various embodiments, the protection circuit may be configured to reduce parasitic leakage sufficiently (i.e., during die operation) such that the protection circuit does not substantially interfere with operation of the semiconductor device. As will be appreciated by a person having ordinary skill in the art, various embodiments disclosed herein may decrease yield fallout and/or reliability issues compared to conventional devices, systems, and methods.

More specifically, as described more fully below, various embodiments of the present disclosure include a protection device (also referred to herein as a "protection circuit") configured to couple a source (SRC) plate to a ground voltage during a processing stage, and isolate the SRC plate from the ground voltage during an operation stage. Yet more specifically, according to various embodiments, a device (e.g., a semiconductor memory device) may include a SRC plate configured to couple to a number of memory cells. The device may also include a protection circuit. The protection circuit may include at least one transistor coupled between the SRC plate and a ground voltage, wherein a gate of the at least one transistor is coupled to a node. The protection circuit may further include a resistive element (e.g., including one or more resistors) coupled between the SRC plate and the node. Further, the at least one transistor may be configured to couple the SRC plate to the ground voltage during a processing stage (e.g., during at least one etching operation, at least one chemical mechanical planarization (CMP) operation, at least one implantation operation, at least one ashing operation, another processing operation, or any combination thereof). Also, the at least one transistor may be configured to isolate the SRC plate from the ground voltage during an operation stage (i.e., during operation of the semiconductor device).

Although various embodiments are described herein with reference to memory devices, the present disclosure is not so limited, and the embodiments may be generally applicable to microelectronic devices that may or may not include semiconductor devices and/or memory devices. Embodiments of the present disclosure will now be explained with reference to the accompanying drawings.

FIG. 1 includes a block diagram of an example memory device 100, according to various embodiments of the present disclosure. Memory device 100, which is and may be referred to herein as a memory device, may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory). Memory device 100, which may be integrated on a semiconductor chip, may include a memory cell array 102.

For example, memory device 100, and more specifically, for example, memory cell array 102, may include one or more protections circuits, as described herein. More specifically, for example, the memory device 100 may include a SRC plate coupled to a number of memory cells of memory cell array. Further, the SRC plate may be coupled to one or more protection circuits.

In the embodiment of FIG. 1, memory cell array 102 is shown as including eight memory banks BANK0-7. More or fewer banks may be included in memory cell array 102 of other embodiments. Each memory bank includes a number of access lines (word lines WL), a number of data lines (bit lines BL) and/BL, and a number of memory cells MC arranged at intersections of the number of word lines WL and the number of bit lines BL and/BL. The selection of a word line WL may be performed by a row decoder 104 and the selection of the bit lines BL and/BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and/BL are coupled to a respective sense amplifier SAMP. Read data from bit line BL or/BL may be amplified by sense amplifier SAMP, and transferred to read/write amplifiers 107 over complementary local data lines (LIOT/B), transfer gate (TG), and complementary main data lines (MIOT/B). Conversely, write data outputted from read/write amplifiers 107 may be transferred to sense amplifier SAMP over complementary main data lines MIOT/B, transfer gate TG, and complementary local data lines LIOT/B, and written in memory cell MC coupled to bit line BL or/BL.

Memory device 100 may be generally configured to receive various inputs (e.g., from an external controller) via various terminals, such as address terminals 110, command terminals 112, clock terminals 114, data terminals 116, and data mask terminals 118. Memory device 100 may include additional terminals such as power supply terminals 120 and 122.

During a contemplated operation, one or more command signals COM, received via command terminals 112, may be conveyed to a command decoder 150 via a command input circuit 152. Command decoder 150 may include a circuit configured to generate various internal commands via decoding one or more command signals COM. Examples of the internal commands include an active command ACT and a read/write signal R/W.

Further, one or more address signals ADD, received via address terminals 110, may be conveyed to an address decoder 130 via an address input circuit 132. Address decoder 130 may be configured to supply a row address XADD to row decoder 104 and a column address YADD to column decoder 106. Although command input circuit 152 and address input circuit 132 are illustrated as separate circuits, in some embodiments, address signals and command signals may be received via a common circuit.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 106 may be activated, and the bit line BL specified by column address YADD may be selected.

In response to active command ACT, a read signal, a row address XADD, and a column address YADD, data may be read from memory cell MC specified by row address XADD and column address YADD. The read data may be output via a sense amplifier SAMP, a transfer gate TG, read/write amplifier 107, an input/output circuit 162, and data terminal 116. Further, in response to active command ACT, a write signal, a row address XADD, and a column address YADD, write data may be supplied to memory cell array 102 via data terminal 116, input/output circuit 162, read/write amplifier 107, transfer gate TG, and sense amplifier SAMP. The write data may be written to memory cell MC specified by row address XADD and column address YADD.

Clock signals CK and/CK may be received via clock terminals 114. A clock input circuit 170 may generate internal clock signals ICLK based on clock signals CK and ICK. Internal clock signals ICLK may be conveyed to various components of memory device 100, such as command decoder 150 and an internal clock generator 172. Internal clock generator 172 may generate internal clock signals LCLK, which may be conveyed to input/output circuit 162 (e.g., for controlling the operation timing of input/output circuit 162). Further, data mask terminals 118 may receive one or more data mask signals DM. When data mask signal DM is activated, overwrite of corresponding data may be prohibited.

According to one or more embodiments, memory cell array 102 may include a 3D NAND array including an array of memory cells (e.g., flash memory cells) arranged such that the memory cells are coupled in logical rows to access lines (also referred to herein as "word lines"). The access lines are coupled to, and in some cases are at least partially formed by, the control gates (CGs) of the memory cells. A string of memory cells of the array are coupled together in series between a SRC plate and a data line, which is conventionally referred to as a bit line.

Figure 2:
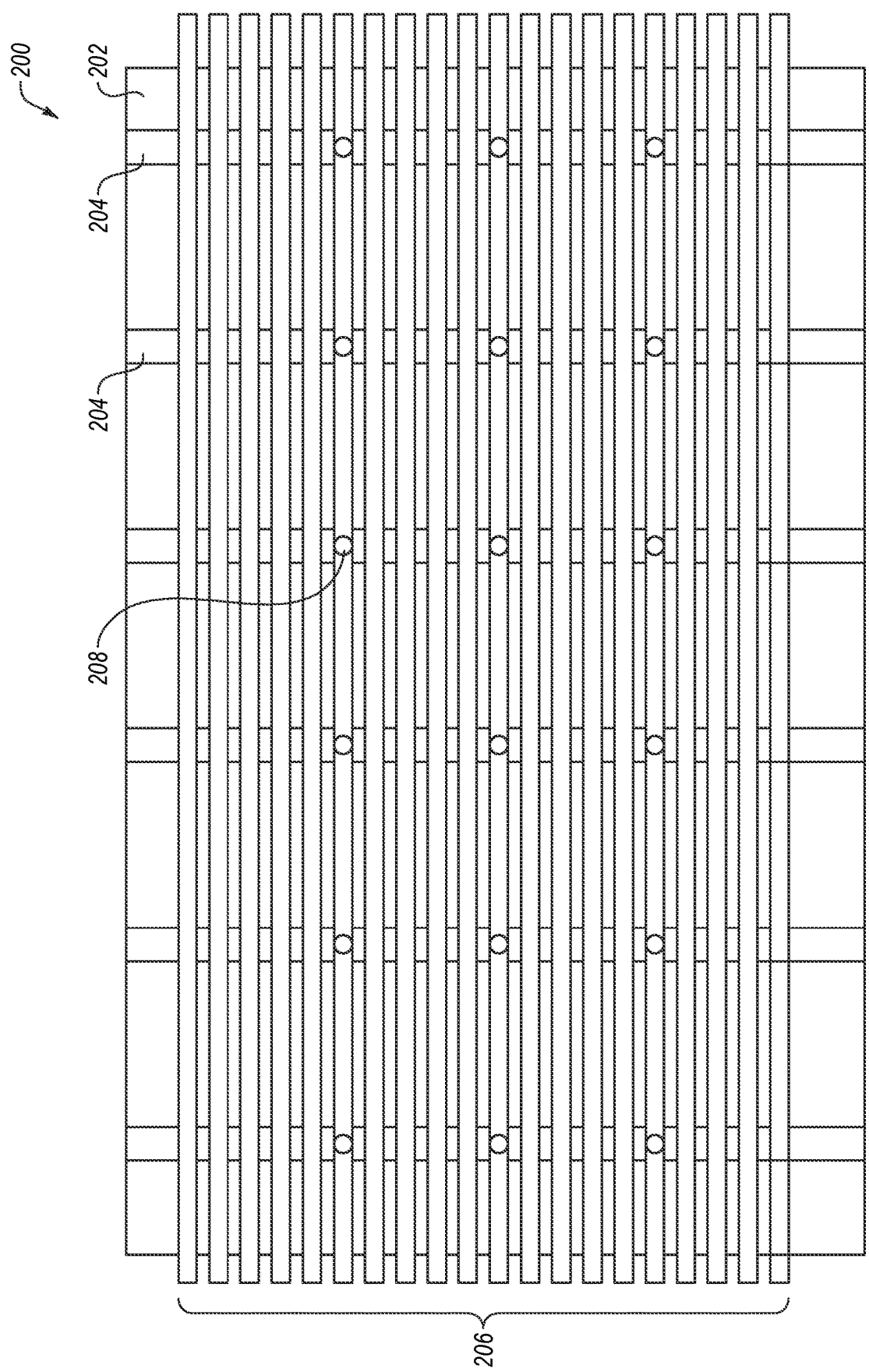
FIG. 2 is a top view of a portion of a 3D memory device.

FIG. 2 is a top view of a portion of a 3D memory device 200. As shown in FIG. 2, 3D memory device 200 (e.g., a 3D NAND array structure) includes a source (SRC) plate 202, source slots 204, and bit lines (BL) 206. Source (SRC) plate 202 may be routed to a source terminal (e.g., a common source line or "CSL") of memory device 200 via conductive source contacts 208. For example, memory device 200 may be part of memory device 100 of FIG. 1.

According to various embodiments of the present disclosure, a semiconductor device (e.g., including memory device 100 of FIG. 1 and/or memory device 200 of FIG. 2) may include a protection circuit configured such that a SRC plate of the semiconductor device may be grounded during a first stage (e.g., during one or more semiconductor processing steps). More specifically, for example, the protection circuit may include one or more transistors (e.g., a NMOS field effect transistor (FET) or a series of NMOS FETS (e.g., in a cascode arrangement)) coupled between the SRC plate and a ground voltage. According to various embodiments, gates of the one or more transistors may be coupled to the SRC plate through a resistor. During one or more processing steps (e.g., one or more etching steps) the gates of the one or more transistors may be biased to the SRC voltage (i.e., through the resistor), such that the one or more transistors may operate as a forward-biased diode-connected transistor (e.g., MOSFET) and prevent the SRC plate from biasing to a high voltage.

Further, during another stage (e.g., after completion of the one or more processing steps and during operation of the semiconductor device), the protection circuit may operate as an open (e.g., highly resistive) circuit. More specifically, after completion of the one or more processing steps and during operation of the semiconductor device, the gates of the one or more transistors may be grounded (e.g., in metal) (i.e., to isolate the SRC plate from the ground voltage to prevent the one or more transistors from interfering with SRC biasing during device operation). According to some embodiments, the one or more transistors may have a sufficiently high breakdown voltage (i.e., so that the one or more transistors may not break down during device operation).

Figure 3:
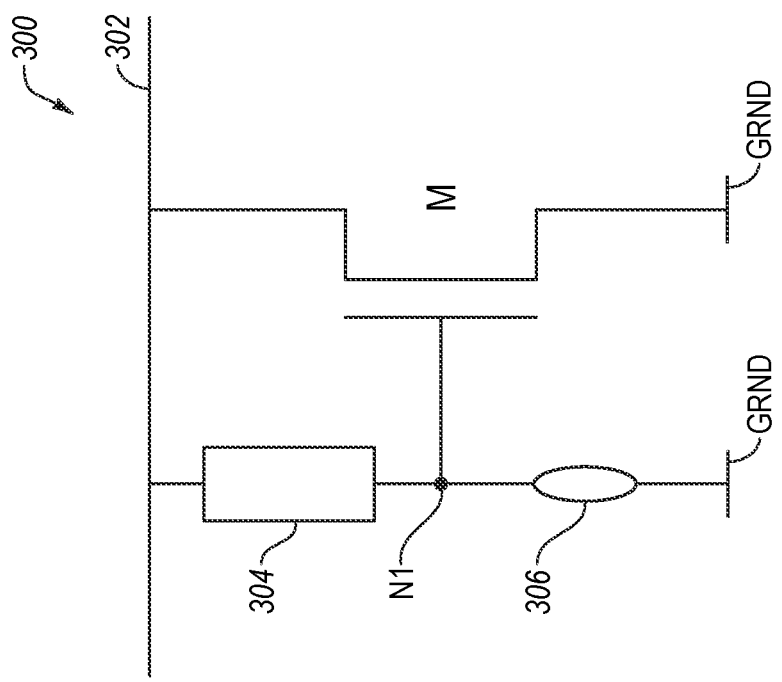
FIG. 3 depicts an example protection circuit, according to various embodiments of the present disclosure.

FIG. 3 depicts an example circuit 300, according to various embodiments of the present disclosure. Circuit 300, which may be part of a semiconductor device (e.g., including memory device 200 of FIG. 2 and/or memory device 100 of FIG. 1), includes a source (SRC) plate (also referred to herein as a "source line" or simply a "source") 302. Circuit 300 further includes a resistive element 304 (e.g., including one or more resistors) coupled between SRC plate 302 and a node N1. Node N1 is further coupled to a deferred electrical connection component (e.g., a metal fuse) 306, which is also coupled to a reference voltage (e.g., a ground voltage GRND). Deferred electrical connection component 306, which may, in some embodiments, include an antifuse, may be configured to isolate node N1 from ground voltage GRND during a first stage (e.g., during one or more processing steps), and couple node N1 to ground voltage GRND during a second stage (e.g., during operation of an associated semiconductor device). For example only, deferred electrical connection component 306 may be a laser fuse, an electrical fuse, or any other suitable fuse.

Circuit 300 further includes a transistor M coupled between SRC plate 302 and ground voltage GRND. More specifically, for example, a first terminal (e.g., a gate) of transistor M is coupled to node N1, a second terminal (e.g., a source) of transistor M is coupled to ground voltage GRND, and third terminal (e.g., a drain) of transistor M is coupled to SRC plate 302.

Although circuit 300 is depicted as including a single transistor, the present disclosure is not so limited, and circuit 300 may include more than one transistor (e.g., a NMOS field (e.g., a series of NMOS FETS (e.g., in a cascode arrangement)) coupled between SRC plate 302 and ground voltage GRND. In these embodiments, the gates of the more than one transistor may be coupled to a common node (e.g., node N1).

For example, during a first stage (e.g., during one or more processing steps to form at least a portion of semiconductor device), transistor M may be in a conductive state, and thus SRC plate 302 is coupled to ground voltage GRND. More specifically, during the first stage, transistor M may function as a forward-biased diode to couple SRC plate 302 to ground voltage GRND and prevent biasing of SRC plate 302 to a high voltage (e.g., around 25-35 volts or more). Further, during a second stage (e.g., during operation of the semiconductor device), node N1 is grounded, and thus transistor M may be in a non-conductive state and SRC plate 302 is isolated from ground voltage GRND. More specifically, during the second stage, transistor M may function as an open circuit.

During device operation (i.e., operation of a semiconductor device including circuit 300), current leakage through resistive element 304 and between SRC plate 302 and ground voltage GRND may exist. Thus, according to various embodiments, a value of resistive element 304 may be of sufficient value such that any current leakage does not interfere with device operation. More specifically, for example, a resistance value of resistive element 304 may be sufficiently high such that current leakage does not load a charge pump during high voltage biasing of SRC plate 302. For example only, assuming a leakage current of 1 μA and a SRC bias voltage of 25 volts, a resistance value of resistive element 304 may be approximately 25 mega ohms (i.e., $R=V/I=25V/10^{-6}A=25$ mega ohms).

Figure 4:
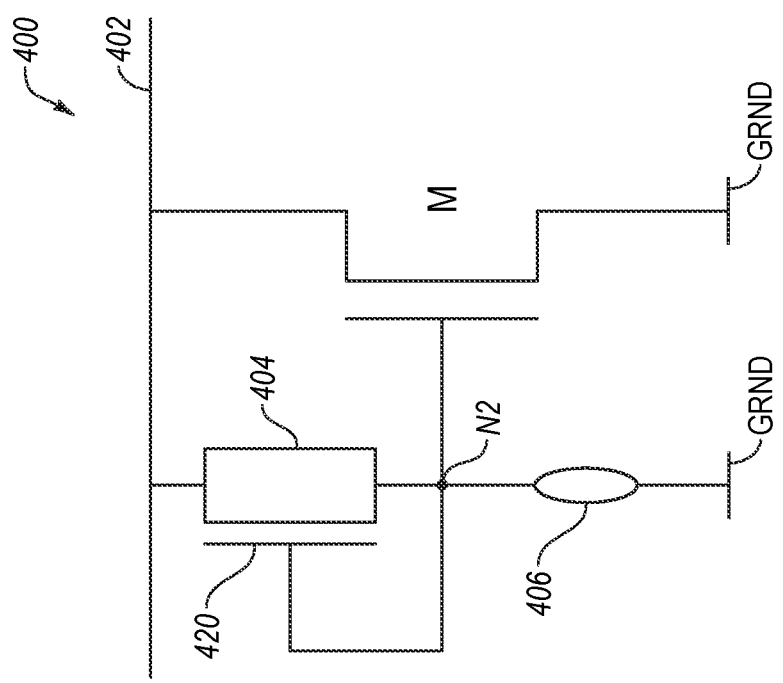
FIG. 4 depicts another example protection circuit, according to various embodiments of the present disclosure.

FIG. 4 depicts another example circuit 400, according to various embodiments of the present disclosure. Like circuit 300 of FIG. 3, circuit 400, which may be part of a semiconductor device, includes SRC plate (also referred to herein as a "source line" or simply a "source") 402. Circuit 400 further includes a resistive element (e.g., including one or more resistors) 404 coupled between SRC plate 402 and a node N2. Node N2 is further coupled to a deferred electrical connection component (e.g., a metal fuse) 406, which is also coupled to a reference voltage (e.g., ground voltage GRND). Similar to deferred electrical connection component 306, deferred electrical connection component 406 may include an antifuse configured to isolate node N2 from ground voltage GRND during a first stage (e.g., during one or more processing steps), and couple node N2 to ground voltage GRND during a second stage (e.g., during operation of an associate semiconductor device). For example only, deferred electrical connection component 406 may be a laser fuse, an electrical fuse, or any other suitable fuse.

Further, like circuit 300, circuit 400 includes transistor M coupled between SRC plate 402 and ground voltage GRND. More specifically, for example, a first terminal (e.g., a gate) of transistor M is coupled to node N2, a second terminal (e.g., a source) of transistor M is coupled to ground voltage GRND, and third terminal (e.g., a drain) of transistor M is coupled to SRC plate 402.

Although circuit 400 is depicted as including a single transistor, the present disclosure is not so limited, and circuit 400 may include more than one transistor (e.g., a NMOS field (e.g., a series of NMOS FETS (e.g., in a cascode arrangement))) coupled between SRC plate 402 and ground voltage GRND. In these embodiments, the gates of the more than one transistor may be coupled to a common node (e.g., node N2).

According to various embodiments, resistive element 404 may include a depletion resistor. More specifically, for example, resistive element 404 may include an N-depletion resistor. For example, a depletion resistor may be formed via a narrow N-active area including an N-implant, which may be formed via one or more implants (e.g., of one or more semiconductor device levels). For example, resistive element 404 may include a narrow (e.g., 0.1-0.25 um wide)N-diffusion active area, which, in some embodiments, may deplete (e.g., fully deplete) at a voltage (e.g., in the range of substantially 5-10 volts).

Further, for example, circuit 400 may include a field plate (e.g., a metal field plate) 420 coupled to a gate of transistor M. In some embodiments, field plate 420, which may be positioned adjacent (e.g., over) resistive element 404 to assist with depletion, may be grounded during, and possibly prior to, a first stage (e.g., during, and possibly prior to, one or more processing steps (e.g., etching steps, planarization steps, implantation steps, ashing steps, other processing steps, or any combination thereof)). Alternatively, in other embodiments, field plate 420 may be floating during the first stage, and subsequently grounded during a second stage (e.g., during device operation).

In some embodiments wherein field plate 420 is coupled to the gate of transistor M (i.e., as depicted in FIG. 4), field plate 420 may provide feedback to improve (e.g., increase) the voltage supplied to the gate of transistor M during the first stage (i.e., one or more processing steps). After processing, and during the second stage (e.g., during device operation), field plate 420 and the gate of transistor M may be grounded.

Alternatively, in other embodiments, field plate 420 may be coupled an antenna (e.g., a number of contacts) (e.g., if an etching process associated with the antenna is an offending processing step) to bias high during the first stage (e.g., during an etching process associated with the antenna) to enable a sufficiently high voltage to be applied to the gate of transistor M. Field plate 420, along with the gate of transistor M, may be grounded during, and possibly prior to, the second stage.

In at least the embodiments of FIG. 4, resistive element 404 may be configured to: 1) pass a voltage to the gate of transistor M to turn transistor M ON during processing; and 2) deplete (i.e., to be highly resistive) during device operation (e.g., when a voltage is applied to SRC plate 402). As will be appreciated, field plate 420 may amplify this effect (i.e., decrease resistance during processing and increase resistance during device operation). For example, resistive element 404 may be configured to fully deplete (e.g., fully deplete) at some voltage in the range of substantially 5-10 volts ("Vpass"). At applied voltages higher than voltage Vpass, resistive element 404 may become highly resistive. For example, during processing of one or more offending steps (e.g., charge-inducing steps), resistive element 404 may pass voltage Vpass to the gate of transistor M, and transistor M may conduct sufficiently (e.g., when a gate voltage of transistor M1 (Vg)=Vpass) to allow current to flow from SRC plate 402 to ground (i.e., to ground voltage GRND). Further, for example, during device operation, (e.g., when SRC plate 402 is at high applied voltages), resistive element 404 may deplete and become highly resistive, thus reducing the parasitic SRC to ground current.

Figure 5:
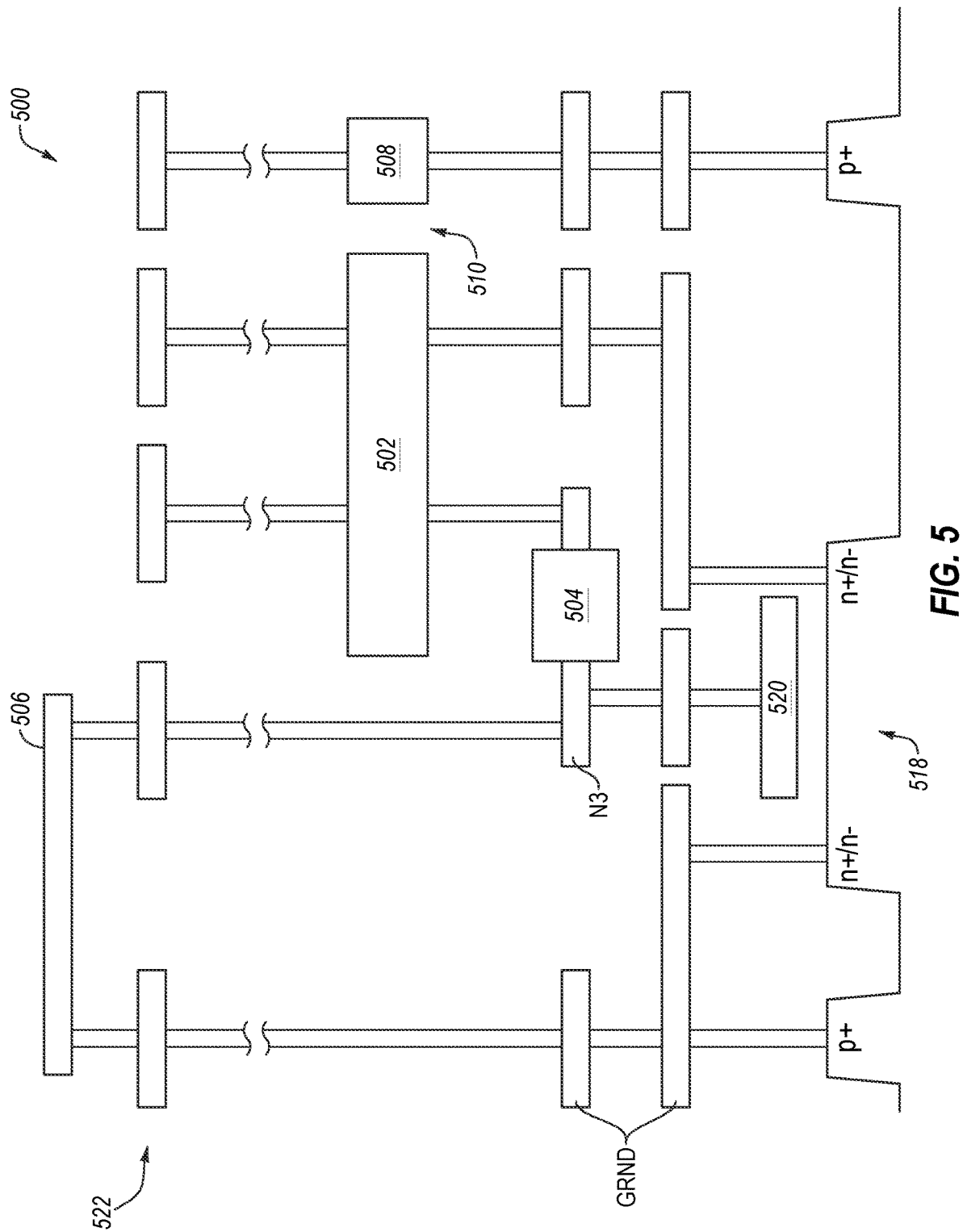
FIG. 5 includes a simplified illustration of a semiconductor device, in accordance with various embodiments of the present disclosure.

FIG. 5 includes a simplified illustration of a semiconductor device 500, in accordance with various embodiments of the present disclosure. Semiconductor device 500 includes an SRC plate 502, a resistor (e.g., a diffusion resistor or a serpentine metal resistor) 504, and a deferred electrical connection component 506. Further, semiconductor device 500 includes a grounded node 508 (e.g., a landing pad for a through-array contact), and a dielectric 510 positioned between SRC plate 502 and grounded node 508. Moreover, semiconductor device 500 includes a transistor 518 having a gate 520.

For example, SRC plate 502 may correspond to SRC plate 302 of circuit 300 (see FIG. 3) and/or SRC plate 402 of circuit 400 (see FIG. 4), resistor 504 may correspond to resistive element 304 of circuit 300 and/or resistive element 404 of circuit 400, and deferred electrical connection component 506 may correspond to deferred electrical connection component 306 of circuit 300 and/or deferred electrical connection component 406 of circuit 400. Further, transistor 518 may correspond to transistor M of circuit 300 and/or circuit 400.

According to various embodiments, during one or more semiconductor processing steps (e.g., etching steps to generate one or more contacts (e.g., node 508), planarization steps, implantation steps, ashing steps, and/or other processing steps), SRC plate 502 may be charged, and transistor 518 may conduct responsive to a charge received from SRC plate 502 via resistor 504. In some embodiments, for some etching processes, resistor 504 may be coupled to SRC plate 502 via a below-array level (e.g., a below-array metal (e.g., Tungsten) layer).

Thus, during the one or more processing steps, SRC plate 502 may be coupled to ground GRND via transistor 518 (e.g., to prevent biasing of SRC plate 502 to a high voltage (e.g., around 25-35 volts or higher)). Accordingly, an electric field between SRC plate 502 and dielectric 510 may be decreased (i.e., compared to conventional systems, device, and methods). As a result, stress applied to dielectric 510 may be decreased, which may increase reliability and/or probe yield of semiconductor device 500.

Further, upon completion of the one or more semiconductor processing steps (i.e., during and possibly prior to operation of semiconductor device 500), a node N3, which is coupled to gate 520 of transistor 518, may be coupled to ground GRND via deferred electrical connection component 506. More specifically, for example, gate 520 of transistor 518 may be coupled to one or more above-array metal layers (e.g., metal layer 522). Thus, during device operation, SRC plate 502 may be isolated from ground GRND via transistor 518. Although, during device operation, some parasitic leakage may occur through resistor 504 to node N3, the parasitic leakage may be sufficiently limited due to the resistance value of resistor 504.

A contemplated operation, according to various embodiments of the present disclosure, will now be described with reference to FIGS. 3 and 4. Initially, a protection circuit 300/400 of a semiconductor device (e.g., semiconductor device 500 of FIG. 5) may be formed (i.e., prior to at least some semiconductor processing steps). More specifically, protection circuit 300/400 may be formed prior to one or more offending (e.g., charge-inducing) processing steps. For example, resistive element 304/404 may be formed via one or more implants of one or more semiconductor layers.

Further, during at least some processing steps (e.g., one or more offending processing steps), SRC plate 302/402 may charge up, transistor M may turn ON (i.e., conduct), and SRC plate 302/402 may be coupled to ground voltage GRND. As a result, biasing of SRC plate 302/402 to a high voltage may be prevented. For example, the RC of resistive element 304/404 and the gate of transistor M be sufficiently low such that the gate voltage Vg does not significantly lag a voltage of SRC plate 302/402.

Upon completion of the one or more processing steps, and prior to device operation, the gate of transistor M1 may be grounded (e.g., hard-grounded) (e.g., to a back-end above-array metal). For example, the gate of transistor M1 may be grounded via deferred electrical connection component 306/406. Accordingly, during device operation, with the gate of transistor M grounded (e.g., hard-grounded), transistor M will not conduct (e.g., above sub-threshold leakage levels), and any parasitic leakage through resistive element 304/404 to ground may be limited due to a high resistance of resistive element 304/404. In an embodiment wherein resistive element 404 comprises an N-depletion resistor, the resistance of resistive element 404 may be relatively high due to the depletion (e.g., full depletion) of resistive element 404. Further, adding field plate 420 to resistive element 404 may further increase the resistance during device operation, and increase Vpass/Vg during processing.

Figure 6:
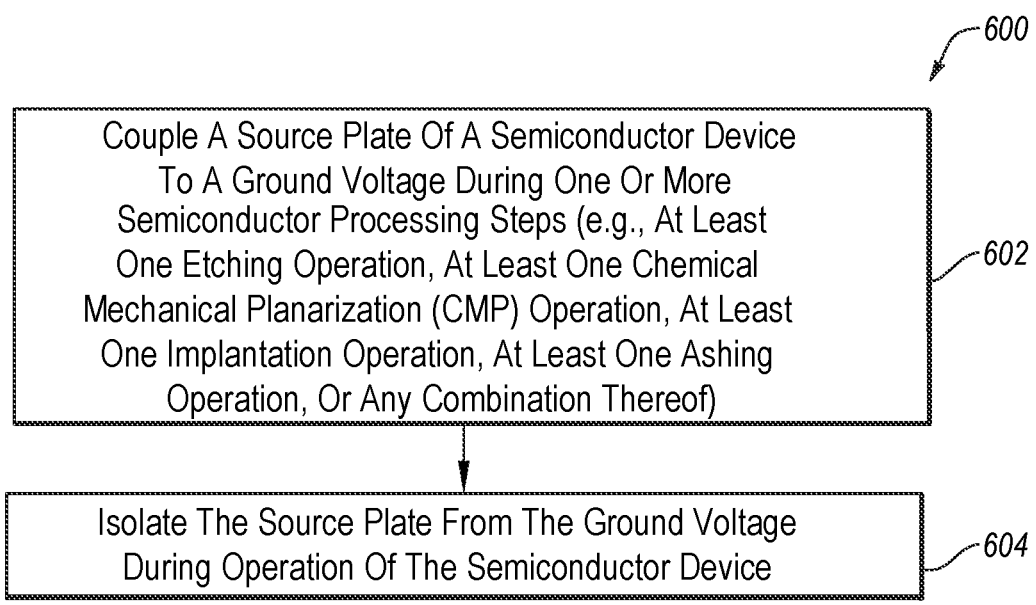
FIG. 6 is a flowchart of an example method of utilizing a protection circuit, in accordance with various embodiments of the present disclosure.

FIG. 6 is a flowchart of an example method 600 of utilizing a protection circuit, in accordance with various embodiments of the disclosure. Method 600 may be arranged in accordance with at least one embodiment described in the present disclosure. At least a portion of method 600 may be performed, in some embodiments, by a device or system, such as memory device 100 of FIG. 1, memory device 200 of FIG. 2, circuit 300 of FIG. 3, circuit 400 of FIG. 4, semiconductor device 500 of FIG. 5, a memory system 700 of FIG. 7, and/or an electronic system 800 of FIG. 8, or another device or system. Although illustrated as discrete blocks, various blocks may be divided into additional blocks, combined into fewer blocks, or eliminated, depending on the desired implementation.

Method 600 may begin at block 602, wherein a source plate of a semiconductor device may be coupled to a ground voltage, and method 600 may proceed to block 604. For example, the source plate may be coupled to the ground voltage while, and possibly prior to, performing one or more semiconductor processing steps (e.g., etching processes). As an example, with reference to FIG. 3, SRC plate 302 may be coupled to ground voltage GRND. More specifically, during one or more offending processing steps (e.g., etching steps), SRC plate 302 may be charged, and, as a result, a charge may be applied to a gate of transistor M, thus causing transistor M to conduct and couple SRC plate 302 to ground voltage GRND.

At block 604, the source plate may be isolated from the ground voltage. For example, the source plate may be isolated from the ground voltage during, and possibly prior to, operation of the semiconductor device. As an example, with reference to FIG. 3, SRC plate 302 may isolated from ground voltage GRND. More specifically, during, and possibly prior to operation of the semiconductor device, a gate of transistor M may be coupled to ground (e.g., ground voltage GRND). Thus, during operation of the semiconductor device, transistor M may not conduct, and therefore SRC plate 302 may be isolated from ground voltage GRND.

Accordingly, the protection circuit may not substantially interfere with operation of the semiconductor device.

Modifications, additions, or omissions may be made to method 600 without departing from the scope of the present disclosure. For example, the operations of method 600 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, a method may include one or more acts wherein a resistive element (e.g., one or more resistors) is formed between the SRC plate and a gate of a transistor, which is coupled between the SRC plate and the ground voltage. Further, for example, a method may include one or more acts wherein the gate of the transistor is coupled to ground. More specifically, for example, the gate of the transistor may be hard-grounded (e.g., via a metal fuse).

A memory system is also disclosed. According to various embodiments, the memory system may include a controller and a number of memory devices. Each memory device may include one or more memory cell arrays, which may include a number of memory cells.

Figure 7:
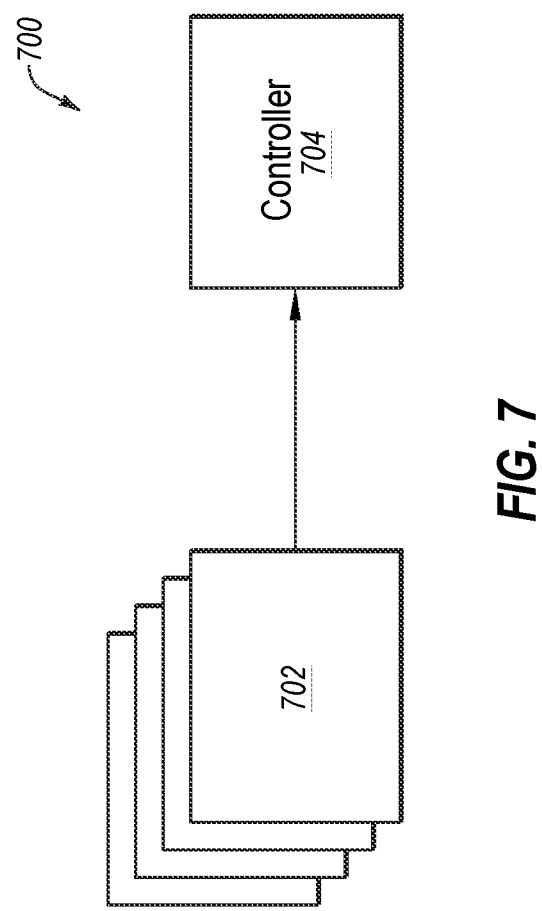
FIG. 7 is a simplified block diagram of a memory system, in accordance with various embodiments of the present disclosure.

FIG. 7 is a simplified block diagram of a memory system 700 implemented according to one or more embodiments described herein. Memory system 700, which may include, for example, a semiconductor device, includes a number of memory devices 702 and a controller 704. For example, at least one memory device 702 may include one or more devices and/or protection circuits, as described herein. Controller 704 may be operatively coupled with memory devices 702 so as to convey command and/or address signals (e.g., command signals COM and/or address signals ADD of FIG. 1) to memory devices 702.

An electronic system is also disclosed. According to various embodiments, the electronic system may include a memory device including a number of memory dies, each memory die having an array of memory cells. Each memory cell may include an access transistor and a storage element operably coupled with the access transistor.

FIG. 8 is a simplified block diagram of an electronic system 800 implemented according to one or more embodiments described herein. Electronic system 800 includes at least one input device 802, which may include, for example, a keyboard, a mouse, or a touch screen. Electronic system 800 further includes at least one output device 804, such as a monitor, a touch screen, or a speaker. Input device 802 and output device 804 are not necessarily separable from one another. Electronic system 800 further includes a storage device 806. Input device 802, output device 804, and storage device 806 may be coupled to a processor 808. Electronic system 800 further includes a memory system 810 coupled to processor 808. Memory system 810 may include memory system 700 of FIG. 7. Electronic system 800 may include, for example, a computing, processing, industrial, or consumer product. For example, without limitation, electronic system 800 may include a personal computer or computer hardware component, a server or other networking hardware component, a database engine, an intrusion prevention system, a handheld device, a tablet computer, an electronic notebook, a camera, a phone, a music player, a wireless device, a display, a chip set, a game, a vehicle, or other known systems.

Various embodiments of the present disclosure may include a device. The device may include a source (SRC) plate configured to couple to a number of memory cells of a memory device. The device may further include a resistor having a first end coupled to the SRC plate. Also, the device may include at least one transistor coupled between the SRC plate and a ground voltage, a gate of the at least one transistor coupled to a second end of the resistor.

According to another embodiment of the present disclosure, a method may include coupling a source plate of a semiconductor device to a ground voltage during one or more semiconductor processing steps. The method may also include isolating the source plate from the ground voltage during operation of the semiconductor device.

Additional embodiments of the present disclosure include an electronic system. The electronic system may include at least one input device, at least one output device, and at least one processor device operably coupled to the input device and the output device. The electronic system may also include at least one memory device operably coupled to the at least one processor device. The at least one memory device may include a source plate coupled to an array of memory cells. The at least one memory device may also include a protection circuit including at least one transistor coupled between the source plate and a ground voltage. A gate of the transistor is coupled to the ground voltage such that the transistor isolates the source plate from the ground voltage. The protection circuit further includes a resistor coupled between the source plate and the gate of the transistor.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

As used herein, the term "device" or "memory device" may include a device with memory, but is not limited to a device with only memory. For example, a device or a memory device may include memory, a processor, and/or other components or functions. For example, a device or memory device may include a system on a chip (SOC).

As used herein, the term "semiconductor" should be broadly construed, unless otherwise specified, to include microelectronic and MEMS devices that may or may not employ semiconductor functions for operation (e.g., magnetic memory, optical devices, etc.).

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
   a source (SRC) configured to couple to a number of memory cells of a memory device;
   a resistor having a first end coupled to the SRC;
   at least one transistor coupled between the SRC and a ground voltage, a gate of the at least one transistor coupled to a second end of the resistor; and
   a deferred electrical connection component including an antifuse or a fuse coupled between the gate of the at least one transistor and the ground voltage.

2. The device of claim 1, wherein the transistor is configured to:
   couple the SRC to the ground voltage during one or more steps to process the memory device; and
   isolate the SRC from the ground voltage during operation of the memory device.

3. The device of claim 2, wherein the gate of the at least one transistor is hard-grounded to isolate the SRC from the ground voltage during the operation of the memory device.

4. The device of claim 2, wherein the one or more steps to process the memory device include at least one etching operation, at least one chemical mechanical planarization (CMP) operation, at least one implantation operation, at least one ashing operation, or any combination thereof.

5. The device of claim 1, wherein the resistor comprises an N-depletion resistor.

6. The device of claim 1, wherein the at least one transistor comprises at least one N-type metal-oxide-semiconductor (NMOS) transistor.

7. A method, comprising:
   coupling, via a transistor, a source of a semiconductor device to a ground voltage during one or more semiconductor fabrication steps associated with the semiconductor device; and
   coupling a gate of the transistor to the ground voltage via an antifuse to isolate the source from the ground voltage during operation of the semiconductor device.

8. The method of claim 7, wherein coupling the source of the semiconductor device to the ground voltage comprises applying, in response to a charge on the source-plate, a sufficient voltage to a gate of a transistor coupled between the source and the ground voltage to cause the transistor to conduct.

9. The method of claim 8, further comprising coupling a resistor between the source and the gate of the transistor.

10. The method of claim 9, wherein coupling the resistor between the source and the gate of the transistor comprises coupling an N-depletion resistor between the source and the gate of the transistor.

11. The method of claim 9, wherein coupling the resistor between the source and the gate of the transistor comprises coupling an N-depletion resistor including a field plate between the source and the gate of the transistor.

12. The method of claim 7, wherein coupling the source of the semiconductor device to the ground voltage comprises coupling the source to the ground voltage during at least one etching operation, at least one chemical mechanical planarization (CMP) operation, at least one implantation operation, at least one ashing operation, or any combination thereof.

13. A system, comprising:
   at least one input device;
   at least one output device;
   at least one processor device operably coupled to the input device and the output device; and
   at least one memory device operably coupled to the at least one processor device and comprising:
      a source coupled to an array of memory cells; and
      a protection circuit including:
         at least one transistor coupled between the source and a ground voltage, a gate of the at least one transistor coupled to the ground voltage such that the at least one transistor isolates the source from the ground voltage;
         a resistor coupled between the source and the gate of the at least one transistor; and
         a deferred electrical connection component including an antifuse coupled between the gate of the at least one transistor and the ground voltage.

14. The system of claim 13, wherein the resistor comprises an N-depletion resistor.

15. The system of claim 14, further comprising a field plate coupled to each of the N-depletion resistor and the gate of the transistor.

16. The system of claim 13, wherein the resistor includes a sufficiently large resistance to prevent the transistor from conducting in response to leakage current from the source.

* * * * *

UNITED STATES PATENT AND TRADEMARK OFFICE
CERTIFICATE OF CORRECTION

PATENT NO. : 11,158,367 B1
APPLICATION NO. : 16/846120
DATED : October 26, 2021
INVENTOR(S) : Marr et al.

It is certified that error appears in the above-identified patent and that said Letters Patent is hereby corrected as shown below:

In the Specification

| | | | |
|---|---|---|---|
| | Column 4, | Line 47, | change "and/BL" to --and /BL-- |
| | Column 4, | Line 49, | change "and/BL" to --and /BL-- |
| | Column 4, | Line 51, | change "and/BL" to --and /BL-- |
| | Column 4, | Line 57, | change "and/BL" to --and /BL-- |
| | Column 4, | Line 58, | change "or/BL" to --or /BL-- |
| | Column 4, | Line 67, | change "or/BL" to --or /BL-- |
| | Column 5, | Line 50, | change "and/CK" to --and /CK-- |
| | Column 7, | Line 12, | change "arrangement))" to --arrangement)))-- |
| | Column 8, | Line 14, | change "N-depletion" to --N- depletion-- |
| | Column 8, | Line 16, | change "N-active" to --N- active-- |
| | Column 8, | Line 16, | change "N-implant" to --N- implant-- |
| | Column 8, | Lines 19-20, | change "wide)N-diffusion" to --wide) N- diffusion-- |
| | Column 10, | Line 24, | change "N-depletion" to --N- depletion-- |

In the Claims

| | | | |
|---|---|---|---|
| Claim 5, | Column 14, | Line 13, | change "N-depletion" to --N- depletion-- |
| Claim 8, | Column 14, | Line 27, | change "source-plate," to --source,-- |
| Claim 10, | Column 14, | Line 35, | change "N-depletion" to --N- depletion-- |
| Claim 11, | Column 14, | Line 39, | change "N-depletion" to --N- depletion-- |
| Claim 14, | Column 14, | Line 67, | change "N-depletion" to --N- depletion-- |
| Claim 15, | Column 15, | Line 2, | change "N-depletion" to --N- depletion-- |

Signed and Sealed this
Fourteenth Day of December, 2021

Drew Hirshfeld
*Performing the Functions and Duties of the
Under Secretary of Commerce for Intellectual Property and
Director of the United States Patent and Trademark Office*